United States Patent
Hong et al.

(10) Patent No.: US 9,105,631 B2
(45) Date of Patent: Aug. 11, 2015

(54) CARRIER TAPE FOR TAB-PACKAGE AND MANUFACTURING METHOD THEREOF

(71) Applicant: LG INNOTEK CO., LTD., Seoul (KR)

(72) Inventors: Tae Ki Hong, Seoul (KR); Dong Guk Jo, Seoul (KR); Han Mo Koo, Seoul (KR); Jun Young Lim, Seoul (KR); Ki Tae Park, Seoul (KR); Sang Ki Cho, Seoul (KR); Dae Sung Yoo, Seoul (KR); Nak Ho Song, Seoul (KR); Joo Chul Kim, Seoul (KR); Jae Sung Jo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/304,526

(22) Filed: Jun. 13, 2014

(65) Prior Publication Data

US 2014/0291004 A1 Oct. 2, 2014

Related U.S. Application Data

(63) Continuation of application No. 12/710,926, filed on Feb. 23, 2010, now Pat. No. 8,791,370.

(30) Foreign Application Priority Data

Nov. 2, 2009 (KR) .................... 10-2009-0105177

(51) Int. Cl.
*H05K 1/11* (2006.01)
*H01L 23/00* (2006.01)
*H01L 23/498* (2006.01)

(52) U.S. Cl.
CPC ............ *H01L 24/50* (2013.01); *H01L 23/4985* (2013.01); *H05K 1/11* (2013.01);
(Continued)

(58) Field of Classification Search
CPC ................................. H05K 1/11; H05K 1/118
USPC .................................. 174/261; 257/666–677
See application file for complete search history.

(56) References Cited

U.S. PATENT DOCUMENTS 6,300,577 B1 10/2001 Tsujii
6,320,135 B1 * 11/2001 Saito ............................ 174/250
(Continued)

FOREIGN PATENT DOCUMENTS

CN 1510743 A 7/2004
CN 1697592 A 11/2005
(Continued)

OTHER PUBLICATIONS

Office Action dated Feb. 21, 2012 in Japanese Application No. 2010-037648, filed Feb. 23, 2010.
(Continued)

*Primary Examiner* — Jeremy C Norris
(74) *Attorney, Agent, or Firm* — Saliwanchik, Lloyd & Eisenschenk (57) ABSTRACT

The present invention relates to a carrier tape for TAB-package and a manufacturing method thereof, wherein a TAB tape including a base film having a central area and edge areas at both directions of the central area, a wiring pattern formed at the central area of the base film, a transfer area formed at the edge area of the base film and exposed by the base film, a plurality of sprocket holes arranged in a row on the transfer area and a metal pattern discretely formed from the wiring pattern, and formed at the edge areas of the base film, wherein the metal pattern is formed with a paired structure formed at both sides of the plurality of sprocket holes, such that the present invention has an advantageous effect in that no Cu layer or a metal layer exists at a portion of the sprocket holes from which friction is generated by a driving roller during assembly work between a drive IC and chips/drive IC and panel to dispense with generation of foreign objects such as Cu particles, thereby enhancing reliability of the product.

10 Claims, 5 Drawing Sheets

(52) U.S. Cl.
CPC ..... *H01L23/49838* (2013.01); *H01L 2924/014* (2013.01); *H01L 2924/01005* (2013.01); *H01L 2924/01006* (2013.01); *H01L 2924/01015* (2013.01); *H01L 2924/01027* (2013.01); *H01L 2924/01029* (2013.01); *H01L 2924/01033* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01); *H01L 2924/14* (2013.01); *H01L 2924/3025* (2013.01); *Y10T 29/49155* (2015.01)

(56) References Cited

U.S. PATENT DOCUMENTS

2005/0274689 A1 12/2005 Sakata et al.
2009/0244901 A1 10/2009 Hu et al.

FOREIGN PATENT DOCUMENTS

| | | |
|---|---|---|
| CN | 1809270 A | 7/2006 |
| JP | S54143161 A | 11/1979 |
| JP | 05-029394 A | 2/1993 |
| JP | 05-095025 A | 4/1993 |
| JP | 2002-246424 A | 8/2002 |
| JP | 2002-299385 A | 10/2002 |
| JP | 2004-281945 A | 10/2004 |
| JP | 2006-128639 A | 5/2006 |
| JP | 2007-059627 A | 3/2007 |
| JP | 2008-004855 A | 1/2008 |
| KR | 10-2003-0054883 A | 7/2003 |
| KR | 10-2003-0077408 A | 10/2003 |
| TW | 538486 | 6/2003 |

OTHER PUBLICATIONS

Office Action dated Jul. 9, 2012 in Chinese Application No. 201010121334.6, filed Feb. 23, 2010.
Office Action dated Mar. 15, 2013 in Chinese Application No. 201010121334.6, filed Feb. 23, 2010.
Office Action dated Apr. 22, 2011 in Korean Application No. 10-2009-0105177, filed Nov. 2, 2009.
Office Action dated Jan. 14, 2014, in Taiwanese Application No. 099104964.
Office Action dated May 13, 2014 in Japanese Application No. 2013-189311.

* cited by examiner

CARRIER TAPE FOR TAB-PACKAGE AND MANUFACTURING METHOD THEREOF

CROSS-REFERENCE TO RELATED APPLICATION

This application is a continuation of application Ser. No. 12/710,926, filed Feb. 23, 2010, which claims the benefit under 35 U.S.C. §119 of Korean Patent Application No. 10-2009-0105177, filed Nov. 2, 2009, which is hereby incorporated by reference in its entirety.

BACKGROUND

1. Field of the Disclosure

The present invention relates to a carrier tape for TAB-package and a manufacturing method thereof.

2. Discussion of the Related Art

Generally, semiconductor chips may be electrically connected to a substrate by various methods. For example, methods of electrically connecting a semiconductor chip to a substrate may include a wire bonding process, a solder bonding process, and a tape automated bonding (TAB) process.

Tape automated bonding (TAB) techniques may employ inner lead bonding (ILB) for inner connections. The TAB techniques also may provide a reel-to-reel package assembly using a reel type tape wiring board. A package manufactured by the TAB technique is referred to as a TAB package.

A tape package is a semiconductor package using a tape substrate. The tape package may be classified as either a tape carrier package (TCP) or a chip-on-film (COF) package.

The TCP may have a structure where the semiconductor chip is bonded to an inner lead, which is exposed through a window (device hole) of the tape substrate, by an inner lead bonding (ILB) process. The TCP is such that the semiconductor chip may be inner lead-bonded to a TAB tape. The inner lead-bonded portion may be sealed using a liquid molding compound through an under-fill process.

The COF package may have a structure where the semiconductor chip is mounted on the tape substrate having no windows, and mounted by a flip-chip bonding process. For example, the semiconductor chip of the COF package may be mounted on a base film. In this case, bumps are formed in a peripheral region of the semiconductor chip and the semiconductor chip is mounted on the base film via the bumps by a flip-chip bonding process.

In other words, conventional COF packages and TCPs differ in several aspects. For example, TCPs are often formed with a window cut-out in the tape to allow backside visibility and access to a mounted semiconductor die, whereas COF packages typically omit the window.

BRIEF SUMMARY

Accordingly, the present invention can provide reliability in the semiconductor package manufacturing process due to the fact that copper or a metal pattern layer does not exist at a row of sprocket holes that generates friction by a driving roller when an assembly process is progressed between a drive integrated circuit (IC) and a chip/drive integrated circuit (IC) to thereby dispense with defects such as copper particles.

In one general aspect of the present invention, a TAB tape including a base film having a central area and edge areas at both directions of the central area, a wiring pattern formed at the central area of the base film, a transfer area formed at the edge area of the base film and exposed by the base film, a plurality of sprocket holes arranged in a row on the transfer area and a metal pattern discretely formed from the wiring pattern, and formed at the edge areas of the base film, wherein the metal pattern is formed with a paired structure formed at both sides of the plurality of sprocket holes.

In some exemplary embodiments, the paired structure is formed at periphery of the sprocket holes.

In some exemplary embodiments, the paired structure is formed adjacent to the sprocket holes.

In some exemplary embodiments, the paired structure is spaced apart from the sprocket holes.

In some exemplary embodiments, the paired structure is discrete from the sprocket holes.

In some exemplary embodiments, each structure of the paired structure includes at least one or more lines.

In some exemplary embodiments, the paired structure is formed with metal plating structure.

In some exemplary embodiments, the paired structure is formed to extend along a length direction of the plurality of sprocket holes.

A metal forming the metal plating layer in the TAB tape may comprise any one metal from a group including Cu, Ni, Pd, Au, Sn, Ag and Co, or a binary alloy or a ternary alloy of the metals.

In another general aspect of the present invention, a method of manufacturing a carrier tape for TAB package, comprises: forming a circuit pattern including a row of sprocket holes and input/output terminal patterns on a base film, wherein an exposure area is formed at a transfer area formed at the edges of the base film.

In some exemplary embodiments, the step of forming the circuit pattern may comprise; forming a circuit pattern through a photolithographic process posterior to a surface activation treatment process of an insulating film, wherein the exposure area formed at the transfer area is formed through a selective etching process.

In some exemplary embodiments, the surface activation treatment process may form a plating treatment layer in a single layer or multiple layers using any one metal from a group including Cu, Ni, Pd, Au, Sn, Ag and Co, or a binary alloy or a ternary alloy of the metals.

In some exemplary embodiments, the step of forming the exposure area may comprise: (a1) coating a photo-resist layer; and (a2) forming a metal plating layer pattern on the transfer area using a photo-mask mounted with a selective removal area pattern through a photolithographic process.

BRIEF DESCRIPTION OF THE DRAWINGS

The accompanying drawings, which are included to provide a further understanding of the present invention and are incorporated in and constitute a part of this application, and together with the description serve to explain the principle of the invention. In the drawings.

DETAILED DESCRIPTION

Hereinafter, implementations of the present invention are described in detail with reference to the accompanying drawings. Detailed descriptions of well-known functions, configurations or constructions are omitted for brevity and clarity so as not to obscure the description of the present invention with unnecessary detail.

The terminology used herein is for the purpose of describing particular implementations only and is not intended to be limiting of the invention. As used herein, the singular forms "a", "an" and "the" are intended to include the plural forms as well, unless the context clearly indicates otherwise.

Furthermore, the same reference numerals will be assigned to the same elements in the explanations of the figures, and explanations that duplicate one another will be omitted.

Figure 1:
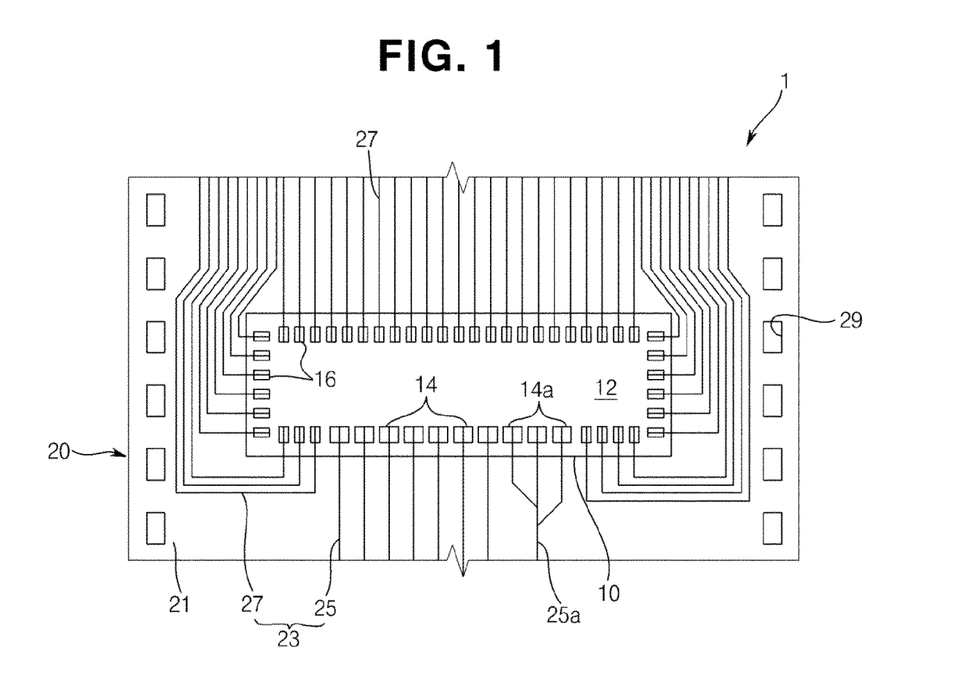
FIG. 1 is a conceptual view illustrating a TAB tape package.

Referring to FIG. 1a, a TAB package (1) may have a structure in which a semiconductor chip (10) is bonded to a wiring pattern (23) of a TAB tape (20) by an inner lead bonding process. The inner lead-bonded portion may be sealed or protected by a liquid molding compound through an under-fill process.

An active surface of the semiconductor chip (10) may be formed with input/output (I/O) pads (14, 16), the I/O pads (14, 16) are fine-pitched to cope with the increased number of the I/O pads (14, 16), and the I/O pads (14, 16) may be implemented in an edge pad type semiconductor chip formed at a periphery of the active surface (12).

The TAB tape (20) may have a structure in which a wiring pattern (23) is formed on a base film (21). The semiconductor is inner lead-bonded to the wiring patterns (23) from the center of the base film (21) and a row of sprocket holes (29) are arranged along the edges of the base film (21) at predetermined intervals.

The wiring patterns (23) may include input terminal patterns (25) extended to one side of the base film (21) relative to the semiconductor chip (10), and output terminal patterns (27) extended to the other side of the base film (21) relative to the semiconductor chip (10).

Ends of the input terminal patterns (25) and the output terminal patterns (27) may extend parallel to the arrangement of the sprocket holes (29).

One end of each input terminal patterns (25a) may be inner lead-bonded to input pads (14a) for power or for grounding and the other ends may be combined for power or for ground, respectively.

However, the TAB tape comprising the above-configured TAP package has a disadvantage in that a conductive metal layer (e.g., copper layer or Cu+ Sn layer) formed on one side of the base film inevitably generates scratches on a Cu surface or a Sn surface during the driving of the display device, resulting in generation of faults and defects. Another disadvantage is that Cu agglomerates are leached during assembly between the panel and the drive IC to reduce the production yield and degradation of reliability due to increased defects.

The present invention provides a carrier tape for TAB-package and a manufacturing method thereof capable of enhancing reliability of the product by fundamentally removing generation of metal particles by forming an exposure area where a base film area is exposed by selectively etching and removing a metal layer at a transfer area of a TAP tape.

Figure 2A:
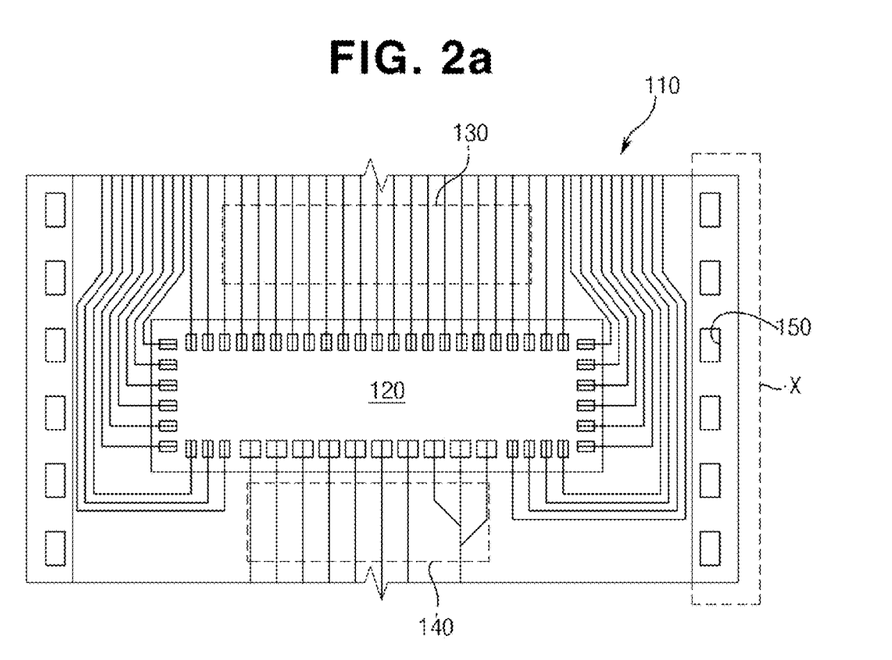
FIGS. 2a and 2b are respectively a configurative view of a TAB tape and an enlarged view of a transfer area comprising the TAB tape according to the present invention.

FIGS. 2a is a schematic view illustrating a TAB tape according to the present invention.

To be more specific, FIG. 2a is a general configuration of the TAB tape of FIG. 1a, particularly of a transfer area (X) including a row of sprocket holes (150). The TAB tape of the present invention may be used to any structure of the aforementioned TCP or COF, and particularly to COF package.

The exemplary embodiment of the present invention will be focused on COF package.

The TAB tape comprising a TAB package according to the present invention may largely include output and input circuit patterns (130, 140), an area where chips are mounted as an inner lead area (120), and a transfer area X formed with a row of sprocket holes (150) so as to be transferred later by a roll.

The transfer area (X) according to the present invention may be differentiated from the conventional one in terms of structural layer. That is, the conventional transfer area is formed with a structure in which an entire TAP tape is formed with Cu or Sn metal layer, where the metal layer is formed on the entire transfer area, the process of which is the one that leads to generation of many faults or defects.

Meanwhile, the present invention has a structure in which a base film is exposed within the transfer area, that is, an area exists where the metal pattern layers such as Cu or Sn layers are not formed according to the present invention to greatly reduce the generation of defects.

Now, a formation structure of transfer area will be described in detail with reference to FIG. 2b.

Figure 2B:
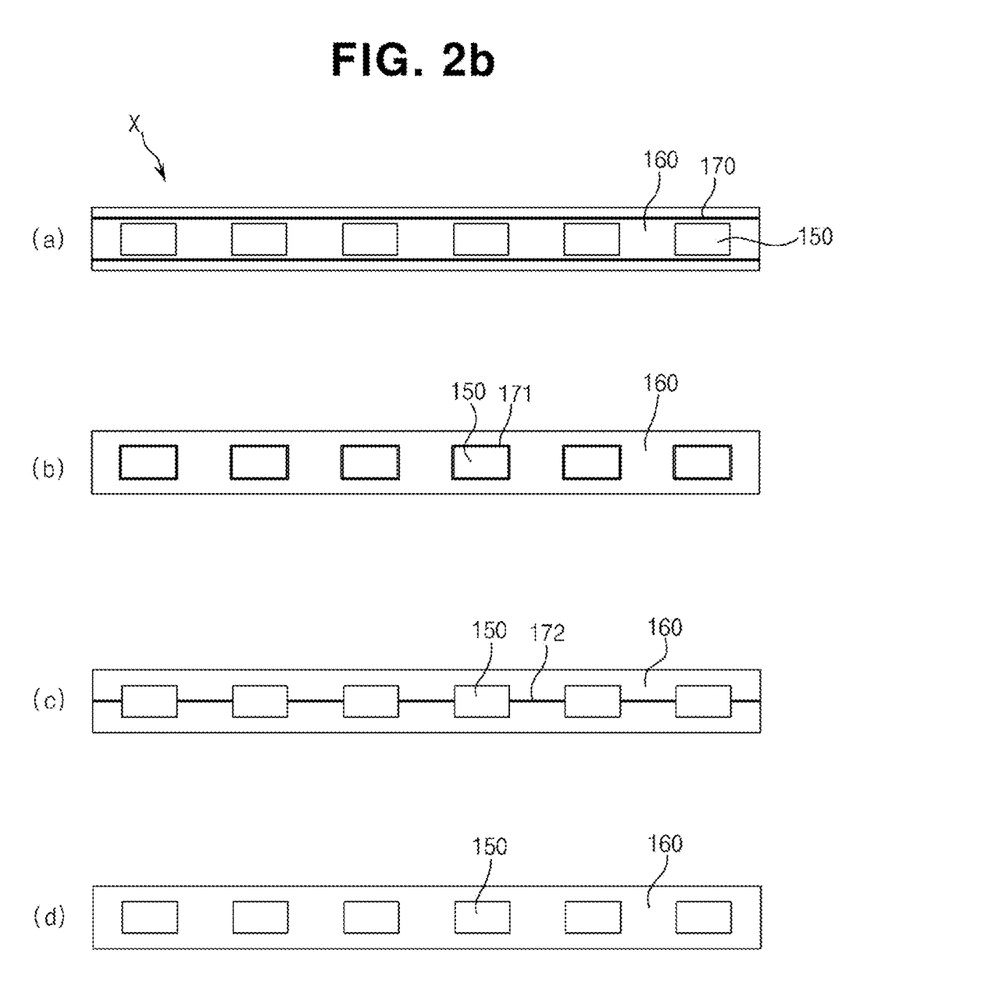

Referring to FIG. 2b(a), the transfer area (X) includes an exposure area (160) where a base film is exposed, and a row of sprocket holes each formed at a predetermined interval. At least one or more plating lines (170) may be formed at a predetermined space apart from the sprocket holes. That is, a metal plating layer pattern may be formed at the periphery of the sprocket holes. In the present exemplary embodiment, the 'metal plating layer pattern' is formed in the structure of the plating line (170).

FIG. 2b(b) illustrates a structure (171) in which the sprocket holes are wrapped by the 'metal plating player pattern'. Although the figure shows a structure in which an entire periphery of the sprocket holes is uniformly wrapped by the metal plating layer pattern, the present exemplary embodiment of the present invention is not limited to such structure. Rather, it should be apparently possible to form a structure where only one sprocket hole is wrapped by the metal plating layer pattern.

That is, the 'metal plating layer pattern' according to the present invention relates to a concept where a 'metal plating layer pattern' is formed on an external periphery of the sprocket hole, and also relates to other concepts of pattern structures where the 'metal plating layer pattern' is formed adjacent to the sprocket holes or discretely formed from the sprocket holes.

That is, the gist of the present exemplary embodiment is such that the metal layer formed on an entire transfer area is selectively removed, and an exposure area is formed to expose the entire base film except for the 'metal plating layer pattern' for obtaining a mechanical strength of the base film being wound on a roll during the transfer operation. It should be apparent that the change of pattern formation of the exposure area belongs to the subject matter of the present invention.

At his time, the meaning of being adjacent defines that at least a predetermined surface or a predetermined area of the metal plating layer pattern is contacted by the sprocket hole FIG. 2b(c) illustrates an example where the 'metal plating layer pattern' is formed by a plating line (172) adjacent to an exterior of the sprocket hole. Of course, as shown in FIG. 2b(d), it is possible to form an exposure area on the entire transfer area by removing all the metal layers of the transfer area, which is to obtain a mechanical strength by adjusting the thickness of the base film.

Figure 2C:
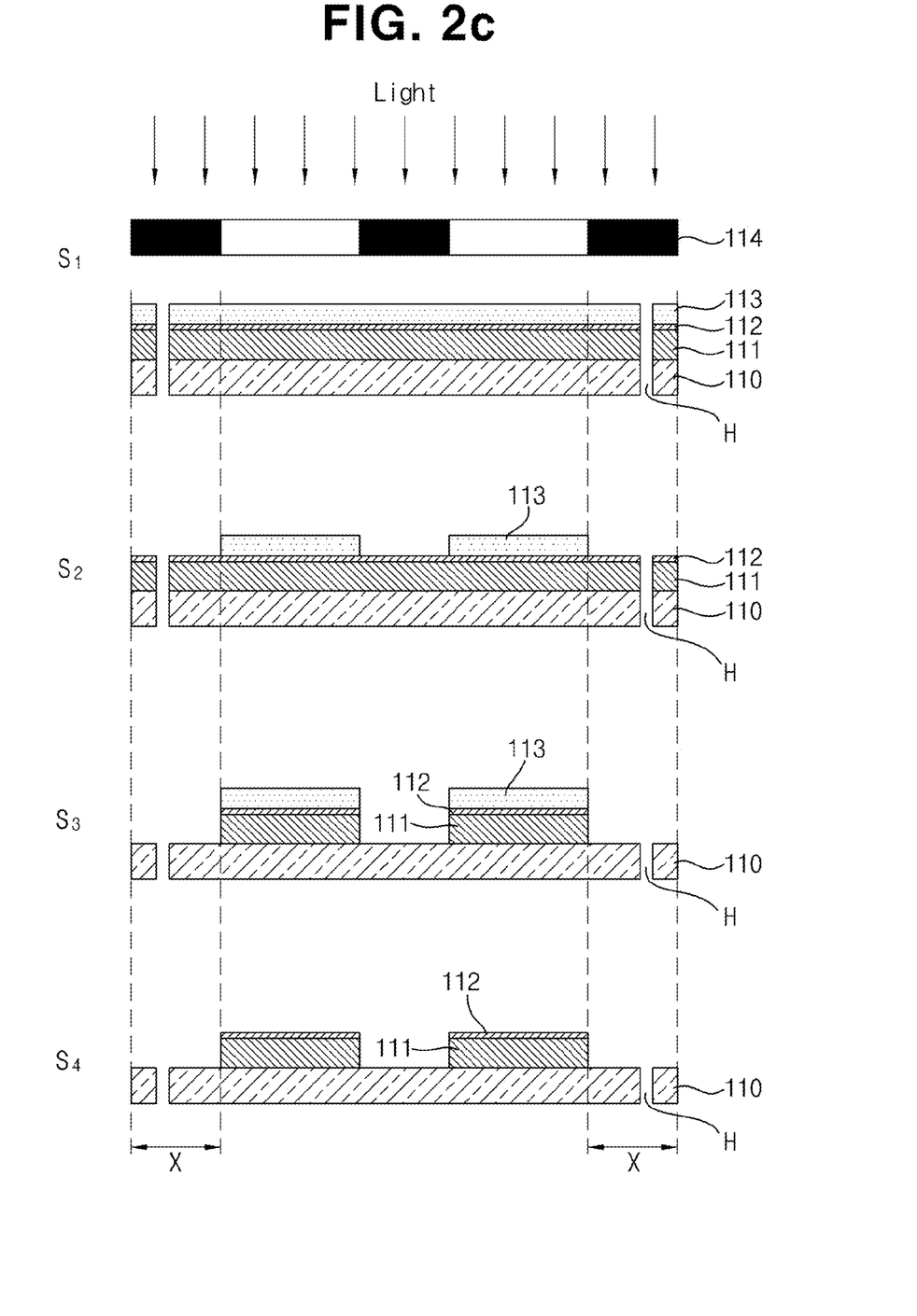
FIG. 2c is a flowchart of manufacturing a TAB tape according to the present invention.

FIG. 2c is a flowchart of manufacturing a TAB tape according to the present invention which shows a process of forming an exposure area of the transfer area and a metal plating layer pattern.

The manufacturing method of a carrier tape for TAB package largely may comprise: forming a circuit pattern including a row of sprocket holes and input/output terminal patterns on a base film (first step); and forming an exposure area at a transfer area formed at the edges of the base film.

To be more specific, the first step may include a formation of a metal layer (111) and a metal plating layer (112) on a base film (110), where the metal layer or the metal plating layer is formed up to a transfer area (X) formed with sprocket holes by mechanical punching process (S1).

Successively, a photo-resist (113) is coated on an upper surface of the metal layer (111) and the metal plating layer (112), and exposure and development processes are performed using an exposure mask (114) to form a pattern (S2).

Particularly, light is blocked on the photo-resist (113) corresponding to the transfer area to remove parts of the photo-resist (113) during photo-resist development. Of course, it should be apparent that conversely, the exposure process is implemented in a case a negative photo-sensitive agent is used.

Thereafter, the metal layer and the metal plating layer (1120 are etched using the photo-resist pattern as an etching mask, where a surface of the base film (110) of the transfer area (X) is preferably exposed (S3). Particularly, in forming the exposure pattern corresponding to the transfer area (X), the entire photo-resist is not removed by etching, but a necessary predetermined portion is formed to implement a patterning and developed, whereby the exposure area and the metal plating layer patterns, e.g., 171 and 178 in FIG. 2b may be simultaneously formed on the transfer area during the etching step. The implementation of the metal plating layer patterns has been already explained through FIG. 2b.

The remaining photo-resist (113) after the etching process is removed to complete the TAB tape according to the present invention (S4).

That is, the present invention is advantageous in that the exposure area in which the base film is exposed is formed by selectively or entirely removing the metal layer or the metal plating layer patterns of the transfer area comprising the TAB tape, thereby markedly decrease the generation of metal foreign objects.

Figure 3:
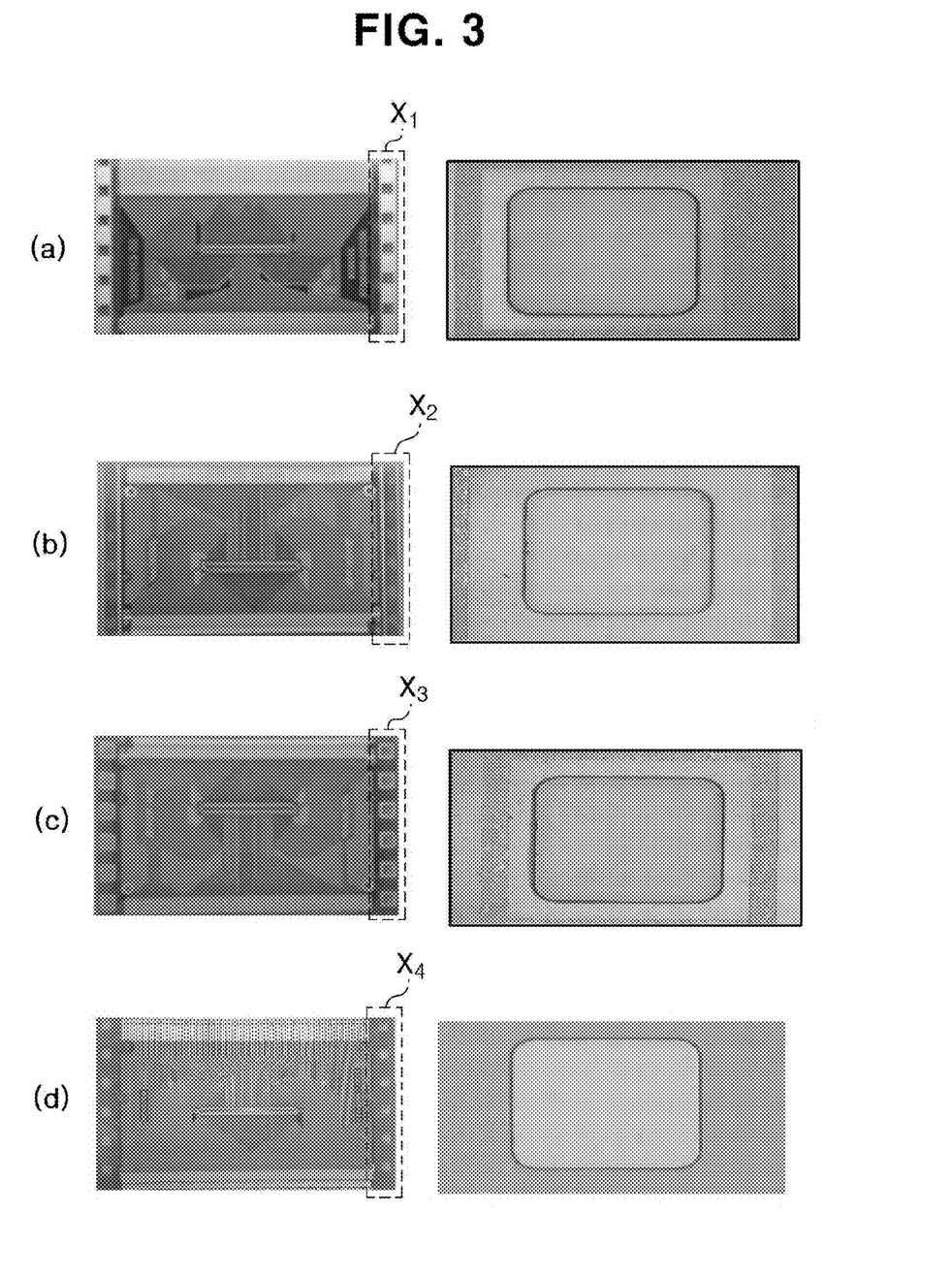
FIG. 3 is an image photograph illustrating generated degrees of defects in a transfer area of the TAB tape of FIG. 1 and generated degrees of defects in a transfer area of the TAB tape according to the present invention.

FIG. 3 is an image of the transfer area of actually manufactured product in the manufacturing process according to the present invention.

FIG. 3 (a) illustrates an actual photographed image of the conventional TAB tape where a Cu or a Cu+Sn layer is formed on a transfer area (X1), where a photograph on the right hand side illustrates a generated degree of foreign objects about a sprocket hole.

FIG. 3(b) illustrates a structure where an exposure area is formed on a transfer area (X2), and a metal plating layer pattern is formed by a plating line, where, as evidenced by an enlarged image about the sprocket hole on the right hand side, it can be confirmed that a metal foreign object such as Sn or the like is hardly generated.

FIG. 3(b) illustrates a structure where an exposure area is formed on a transfer area (X3), and a metal plating layer pattern is formed about sprocket holes and an adjacent surrounding area, where, as evidenced by an enlarged image about the sprocket hole on the right hand side, it can be confirmed that a metal foreign object such as Sn or the like is hardly generated, either.

FIG. 3(d) illustrates a structure where a metal layer of a transfer area (X4) is entirely removed, where it can be confirmed that a metal foreign object such as Sn or the like is hardly generated.

The present invention has an advantageous effect in that no Cu layer or a metal layer exists at a portion of the sprocket holes from which friction is generated by a driving roller during assembly work between a drive IC and chips/drive IC and panel to dispense with generation of foreign objects such as Cu particles, thereby enhancing reliability of the product.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A TAB tape, comprising:
a base film having a central area and edge areas at both directions of the central area;
a wiring pattern formed at the central area of the base film;
a transfer area formed at the edge area of the base film and including an exposure area exposing the base film;
a plurality of sprocket holes arranged in a row on the transfer area; and
a metal pattern discretely formed from the wiring pattern, and formed in the transfer area,
wherein the metal pattern is formed with a paired structure formed at both sides of the plurality of sprocket holes, and
wherein the exposure area is continuous between the sprocket holes such that the base film is exposed continuously between each sprocket hole and its adjacent sprocket holes.

2. The TAB tape of claim 1, wherein the paired structure is formed at periphery of the sprocket holes.

3. The TAB tape of claim 1, wherein the paired structure is formed adjacent to the sprocket holes.

4. The TAB tape of claim 1, wherein the paired structure is spaced apart from the sprocket holes.

5. The TAB tape of claim 1, wherein the paired structure is discrete from the sprocket holes.

6. The TAB tape of claim 1, wherein each structure of the paired structure includes at least one or more lines.

7. The TAB tape of claim 1, wherein the paired structure is formed with metal plating structure.

8. The TAB tape of claim 1, wherein the paired structure is formed to extend along a length direction of the plurality of sprocket holes.

9. The TAB tape of claim 1, wherein the metal pattern comprises:
a first metal line running along a first side of the plurality of sprocket holes; and
a second metal line discrete from the first metal line and running along a second side of the plurality of sprocket holes opposite from the first side.

10. A TAB tape, comprising:
a base film;
a wiring pattern formed at a central area of the base film;
a transfer area formed at an edge area of the base film and including an exposure area exposing the base film;
a plurality of sprocket holes arranged in a row on the transfer area; and
a metal pattern discretely formed from the wiring pattern, and formed in the transfer area;
wherein the exposure area is continuous between the sprocket holes such that the base film is exposed continuously between each sprocket hole and its adjacent sprocket holes, wherein the metal pattern comprises a plurality of metal plating patterns, and wherein each metal plating pattern is formed around a periphery of a sprocket hole of the plurality of sprocket holes.

* * * * *